United States Patent
Tayebati et al.

(10) Patent No.: US 6,762,938 B2
(45) Date of Patent: Jul. 13, 2004

(54) APPARATUS AND METHOD FOR PROVIDING AUXILIARY COOLING AND THERMAL STABILITY TO AN OPTO-ELECTRONIC COMPONENT

(75) Inventors: Parviz Tayebati, Boston, MA (US); Brian Cranton, Haverhill, MA (US); Daryoosh Vakhshoori, Cambridge, MA (US); Masud E. Azimi, Belmont, MA (US); Kevin J. McCallion, Charlestown, MA (US)

(73) Assignee: Coretek, Inc., Billerica, MA (US)

( * ) Notice: Subject to any disclaimer, the term of this patent is extended or adjusted under 35 U.S.C. 154(b) by 218 days.

(21) Appl. No.: 10/021,936

(22) Filed: Dec. 13, 2001

(65) Prior Publication Data

US 2003/0002255 A1 Jan. 2, 2003

Related U.S. Application Data

(60) Provisional application No. 60/276,402, filed on Mar. 16, 2001.

(51) Int. Cl.$^7$ ................................................. H05K 7/20
(52) U.S. Cl. ........................ 361/704; 361/707; 62/3.2; 257/930
(58) Field of Search ................................ 361/704, 707, 361/719; 62/3.2; 165/80.2, 80.3, 185; 257/706, 712, 930

(56) References Cited

U.S. PATENT DOCUMENTS

| | | | | |
|---|---|---|---|---|
| 4,402,185 A | * | 9/1983 | Perchak | 62/3.3 |
| 5,040,381 A | * | 8/1991 | Hazen | 62/3.2 |
| 5,637,921 A | * | 6/1997 | Burward-Hoy | 257/712 |
| 6,043,982 A | * | 3/2000 | Meissner | 361/704 |
| 6,252,726 B1 | * | 6/2001 | Verdiell | 359/820 |
| 6,415,612 B1 | * | 7/2002 | Pokharna et al. | 62/3.2 |
| 6,455,930 B1 | * | 9/2002 | Palanisamy et al. | 257/706 |
| 6,525,934 B1 | * | 2/2003 | Nakanishi et al. | 361/687 |

* cited by examiner

Primary Examiner—Boris Chervinsky

(57) ABSTRACT

Apparatus is disclosed for providing auxiliary cooling and thermal stability to a temperature sensitive opto-electronic component. The disclosed apparatus comprising a primary thermal control system having a first thermal connection with a primary structure supporting at least one component of an optical system and a second thermal connection being thermally connected with an external environment; and an auxiliary thermal control system having a first thermal connection being thermally connected with the temperature sensitive opto-electronic component, and the auxiliary thermal control system having a second thermal connection being thermally connected with the primary thermal control system whereby the auxiliary thermal control system provides cooling to the temperature sensitive opto-electronic component and the primary thermal control system provides additional cooling to the auxiliary thermal control system through temperature regulation of the primary structure.

15 Claims, 5 Drawing Sheets

APPARATUS AND METHOD FOR PROVIDING AUXILIARY COOLING AND THERMAL STABILITY TO AN OPTO-ELECTRONIC COMPONENT

REFERENCE TO PENDING PRIOR PATENT APPLICATION

This patent application claims benefit of pending prior U.S. Provisional Patent Application Serial No. 60/276,402, filed Mar. 16, 2001 by Kevin J. Knopp et al. for VERTICAL-CAVITY SURFACE-EMITTING LASER WITH CAVITY COMPENSATED GAIN, which patent application is hereby incorporated herein by reference.

FIELD OF THE INVENTION

The present invention relates to semiconductor opto-electronic devices in general and, more particularly, to cooling of opto-electronic devices.

BACKGROUND OF THE INVENTION

Most commercially available opto-electronic components are positioned on optical platforms designed to operate at 25° C. Significantly better performance of some opto-electronic components is achieved at lower temperatures, such as 15° C. or less. However, traditional thermal management systems for opto-electronic modules are limited in achieving low optical platform temperatures while supporting the high end of typical opto-electronic package operating temperature ranges. These operation temperature ranges include environments in excess of 70°–80° C.

In addition, the optical alignment of the opto-electronic modules must not be compromised by the thermal management system and the overall module must be commercially viable.

SUMMARY OF THE INVENTION

One object of the present invention is, therefore, to provide a novel apparatus for cooling an opto-electronic device.

Another object of the present invention is to provide a novel apparatus for cooling an opto-electronic device using an auxiliary cooling system thermally connected to the opto-electronic device and also thermally connected to a primary cooling device, and with the opto-electronic device being isolated from direct thermal effects of the primary cooling device. In a preferred embodiment of the invention, an independent temperature sensor, which is mounted close to the temperature sensitive components, is used to control the auxiliary cooling system.

Yet another object of the present invention is to provide a novel method for cooling an opto-electronic device.

Still another object of the present invention is to provide a novel method for cooling an opto-electronic device using an auxiliary cooling system thermally connected to the opto-electronic device and also thermally connected to a primary cooling device, and with the opto-electronic device being thermally isolated from direct effects of the primary cooling device. In a preferred embodiment of the invention, an independent temperature sensor, which is mounted close to the temperature sensitive components, is used to control the auxiliary cooling system.

And another embodiment of the present invention is to provide a novel apparatus for targeting cooling power to a selected opto-electronic device with an auxiliary cooling system so as to consume less power by cooling the selected opto-electronic device and allowing other components to function at a higher temperature.

Yet still another object of the present invention is to provide a novel method for selectively targeting a disproportionately large amount of cooling power to selected components which benefit from that additional cooling without targeting excess cooling power to other components.

These and other objects of the present invention are addressed by the provision and use of a novel method and apparatus for cooling an opto-electronic device.

In accordance with a feature of the present invention, there is provided a novel apparatus for providing auxiliary cooling and thermal stability to a temperature sensitive opto-electronic component, the apparatus comprising: a primary thermal control system having a first thermal connection with a primary structure supporting at least one component of an optical system and a second thermal connection being thermally connected with an external environment; and an auxiliary thermal control system having a first thermal connection being thermally connected with the temperature sensitive opto-electronic component, and the auxiliary thermal control system having a second thermal connection being thermally connected with the primary thermal control system whereby the auxiliary thermal control system provides cooling to the temperature sensitive opto-electronic component and the primary thermal control system provides additional cooling to the auxiliary thermal control system through temperature regulation of the primary structure.

In accordance with a further feature of the present invention, there is provided a novel method for providing auxiliary cooling and thermal stability to a temperature sensitive opto-electronic component, the method comprising: providing an apparatus comprising: an apparatus for providing auxiliary cooling and thermal stability to a temperature sensitive opto-electronic component, the apparatus comprising: a primary thermal control system having a first thermal connection with a primary structure supporting at least one component of an optical system and a second thermal connection being thermally connected with an external environment; and an auxiliary thermal control system having a first thermal connection being thermally connected with the temperature sensitive opto-electronic component, and the auxiliary thermal control system having a second thermal connection being thermally connected with the primary thermal control system whereby the auxiliary thermal control system provides cooling to the temperature sensitive opto-electronic component and the primary thermal control system provides additional cooling to the auxiliary thermal control system through temperature regulation of said primary structure; and cooling the temperature sensitive opto-electronic component with the auxiliary thermal control system.

BRIEF DESCRIPTION OF THE DRAWINGS

The above and other objects and features of the present invention will be more fully discussed in the following detailed description of the preferred embodiments of the invention, which is to be considered together with the accompanying drawings wherein like numbers refer to like parts, and further wherein.

DETAILED DESCRIPTION OF THE PREFERRED EMBODIMENTS

Figure 1:
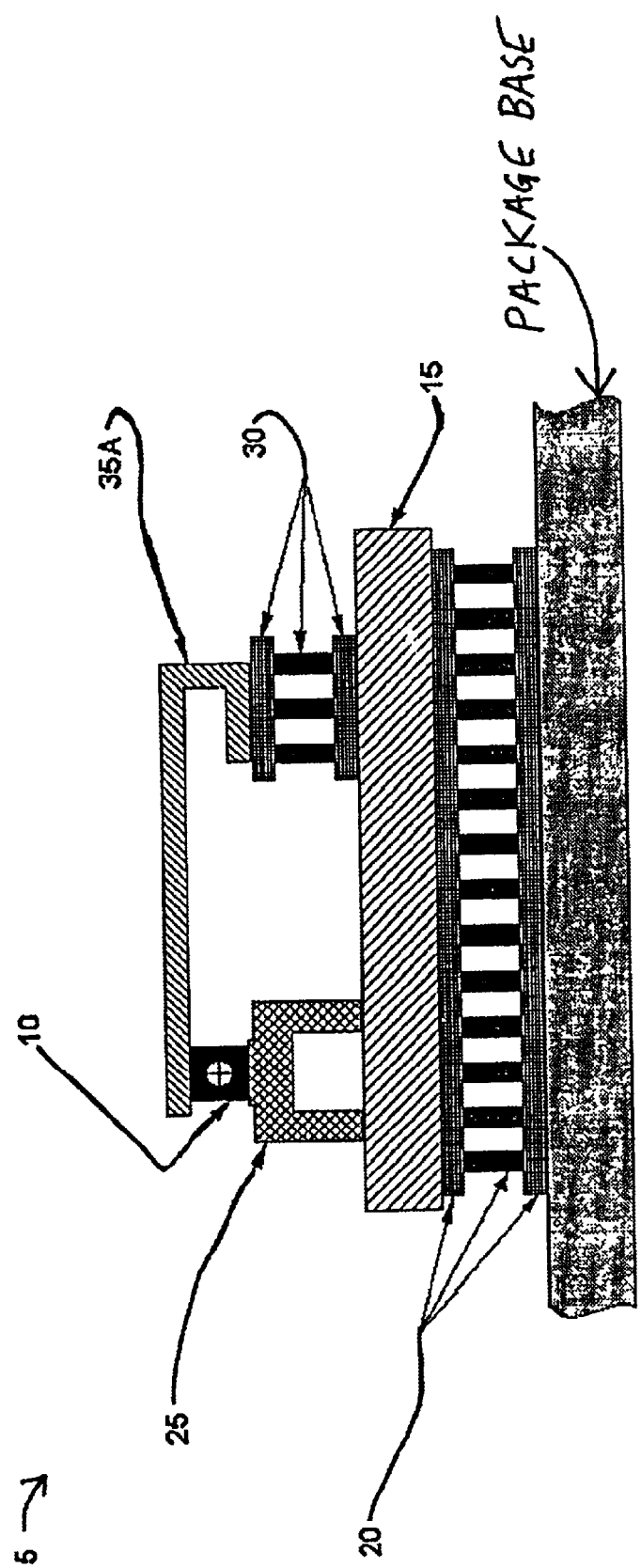
FIG. 1 is a cross-sectional diagrammatical view of an optical platform having an auxiliary thermal management system including a thermally conductive flexure to thermally connect a temperature sensitive component attached to an insulated mount to an auxiliary cooling device.

A system 5 is shown in FIGS. 1–5 for providing auxiliary cooling and temperature stability to a temperature sensitive opto-electronic component, such as a sensitive component 10.

Referring to FIGS. 1–5, system 5 generally includes an optical platform 15 having a primary thermal control system 20, a thermally insulated mount 25 in attachment to optical platform 15, an auxiliary thermal control system 30 in attachment to optical platform 15, and a thermal connection 35, e.g., a flexure 35A, a set of intermeshed fins 35B, a structurally compliant plate 35C, and conductive strands 35D. In a preferred embodiment of the invention, thermal connection 35 includes a structurally compliant heat path for heat exchange with temperature sensitive component 10. Such a compliant connection 35 compensates for thermal expansion or contraction without effecting the optical alignment or performance of temperature sensitive component 10.

Still referring to FIGS. 1–5, auxiliary thermal control system 30 generally comprises a heating/cooling source, such as a thermo-electric cooler or, TEC, herein shown as reference number 30, and an auxiliary cooling system temperature sensor (not shown) separate from the temperature sensor used in the primary thermal control system 20. In a preferred embodiment of the invention, the cooling effect of auxiliary thermal control system 30 is supplemented by primary thermal control system 20 of optical platform 15.

Now looking at FIGS. 1–4, four design variations are shown with each having a different thermal connection 35 to create flexible, thermally conductive paths. In each of these variations, temperature sensitive component 10 is securely attached to optical platform 15 by thermally insulated mount 25. In a preferred embodiment of the invention, the auxiliary cooling system temperature sensor (not shown) is mounted directly to temperature sensitive component 10 to maximize temperature control and stability of auxiliary thermal management system 30.

Looking at FIG. 1, in a preferred embodiment of the invention, thermal connection 35 comprises thermally conductive flexure 35A between temperature sensitive component 10 and auxiliary thermal control system 30. In this embodiment of the invention, temperature sensitive component 10 is thermally isolated from optical platform 15, and is supported in optical alignment, by thermally isolating mount 25. Flexure 35A is compliant to provide a conductive heat path between sensitive component 10 and auxiliary thermal control system 30. The compliant heat path allows auxiliary thermal control system 30 cool and to closely regulate the temperature of the thermally isolated sensitive component 10 while flexure 35A compensates for any thermal expansion or contraction in thermal connection 35. This compensation of flexure 35A during heat transfer prevents the optical alignment of sensitive component 10 from being disturbed. Simultaneously, primary thermal control system 20 regulates the temperature of optical platform 15 and any other components (not shown) in attachment thereto. As such, primary thermal control system 20 is configured in a preferred embodiment of the invention to provide temperature regulation of optical platform 15 and additional cooling to auxiliary thermal control system 30. Due to this additional cooling, auxiliary thermal control system 30 is able to provide additional cooling to temperature sensitive component 10.

Figure 2:
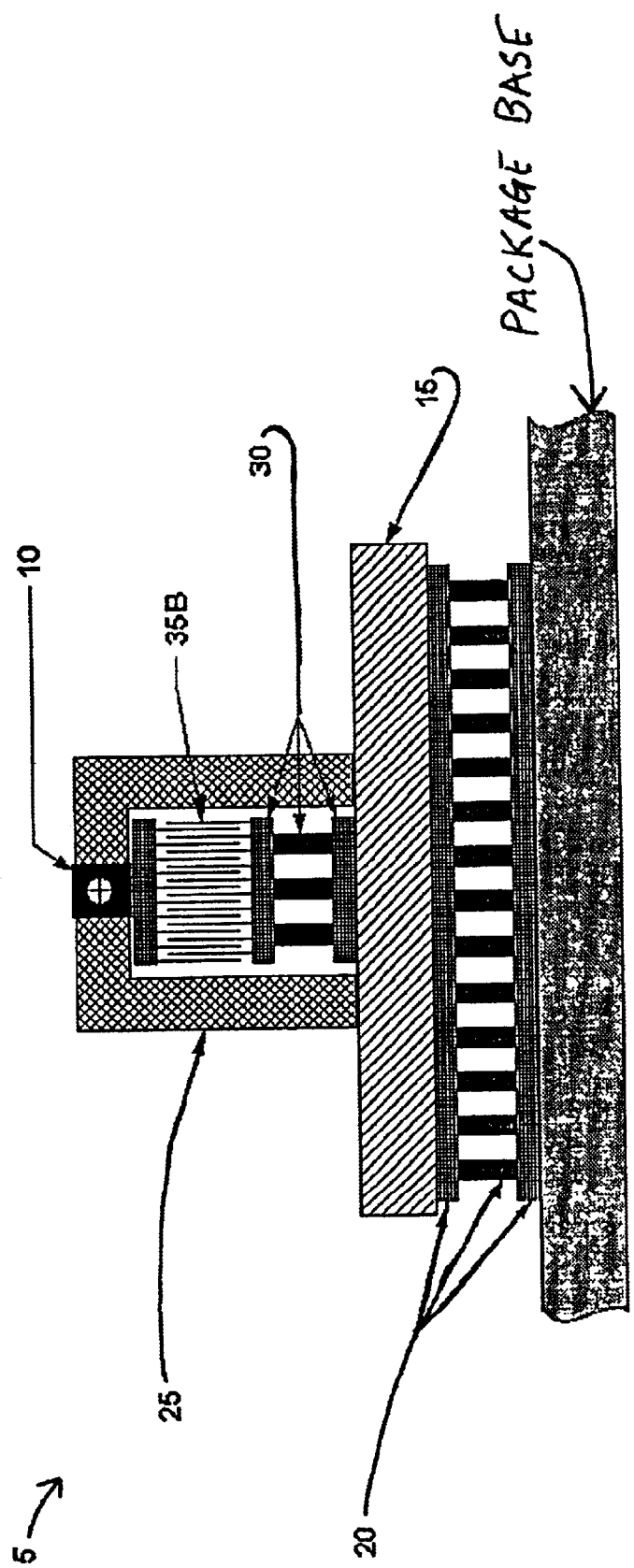
FIG. 2 is a cross-sectional diagrammatical view of an optical platform having an auxiliary thermal management system including intermeshed fins to thermally connect a sensitive component attached to an insulated mount to an auxiliary cooling device.

Looking at FIG. 2, in a preferred embodiment of the invention, thermal connection 35 comprises intermeshed fins 35B between temperature sensitive component 10 and auxiliary thermal control system 30. In this embodiment of the invention, temperature sensitive component 10 is thermally isolated from optical platform 15, and is supported in optical alignment, by thermally isolating mount 25. Intermeshed fins 35B can move independent of each other while still providing a conductive heat path between temperature sensitive component 10 and auxiliary thermal control system 30. The structurally adjustable heat path allows auxiliary thermal control system 30 to cool and closely regulate the temperature of thermally isolated sensitive component 10 while intermeshed fins 35B compensate for any thermal expansion or contraction in thermal connection 35. This compensation of intermeshed fins 35B during heat transfer prevents the optical alignment of temperature sensitive component 10 from being disturbed. Simultaneously, primary thermal control system 20 regulates the temperature of optical platform 15 and any other components (not shown) in attachment thereto. As such, primary thermal control system 20 is configured to in this preferred embodiment of the invention to provide temperature regulation of optical platform 15 and additional cooling to auxiliary thermal control system 30. Due to this additional cooling, auxiliary thermal control system 30 is able to provide additional cooling to temperature sensitive component 10.

Figure 3:
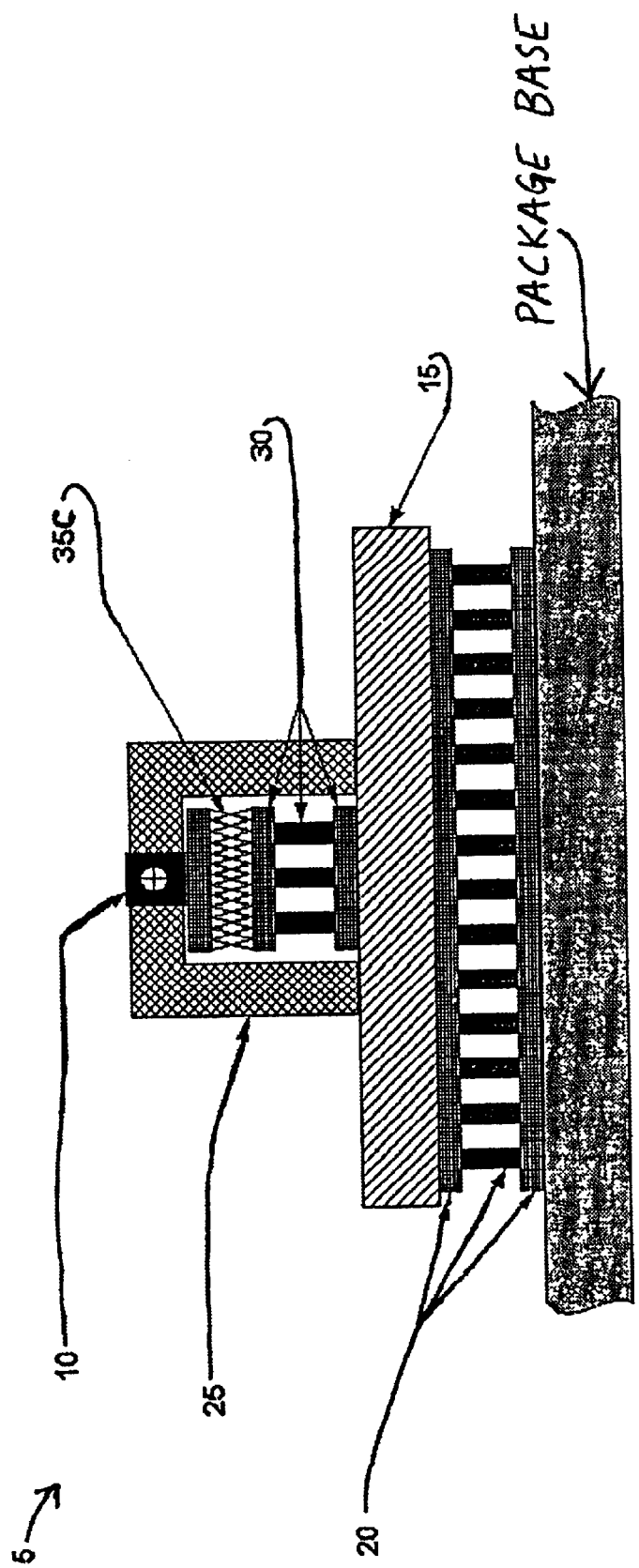
FIG. 3 is a cross-sectional diagrammatical view of an optical platform having an auxiliary thermal management system including a structurally compliant, thermally conductive plate to thermally connect a temperature sensitive component attached to an insulated mount to an auxiliary cooling device.

Looking at FIG. 3, in a preferred embodiment of the invention, thermal connection 35 comprises structurally compliant plate 35C between temperature sensitive component 10 and auxiliary thermal control system 30. In this embodiment of the invention, temperature sensitive component 10 is thermally isolated from optical platform 15, and is supported in optical alignment, by thermally isolating mount 25. Structurally compliant plate 35C provides a conductive heat path between temperature sensitive component 10 and auxiliary thermal control system 30. The compliant heat path allows auxiliary thermal control system 30 to cool and closely regulate the temperature of thermally isolated temperature sensitive component 10 while structurally compliant plate 35C compensates for any thermal expansion or contraction in thermal connection 35. This compensation of structurally compliant plate 35C during heat transfer prevents the optical alignment of sensitive component 10 from being disturbed. Simultaneously, primary thermal control system 20 regulates the temperature of optical platform 15 and any other components (not shown) in attachment thereto. As such, primary thermal control system 20 is configured in this preferred embodiment of the invention to provide temperature regulation of optical platform 15 and additional cooling to auxiliary thermal control system 30. Due to this additional cooling, auxiliary thermal control system 30 is able to provide additional cooling to temperature sensitive component 10.

Figure 4:
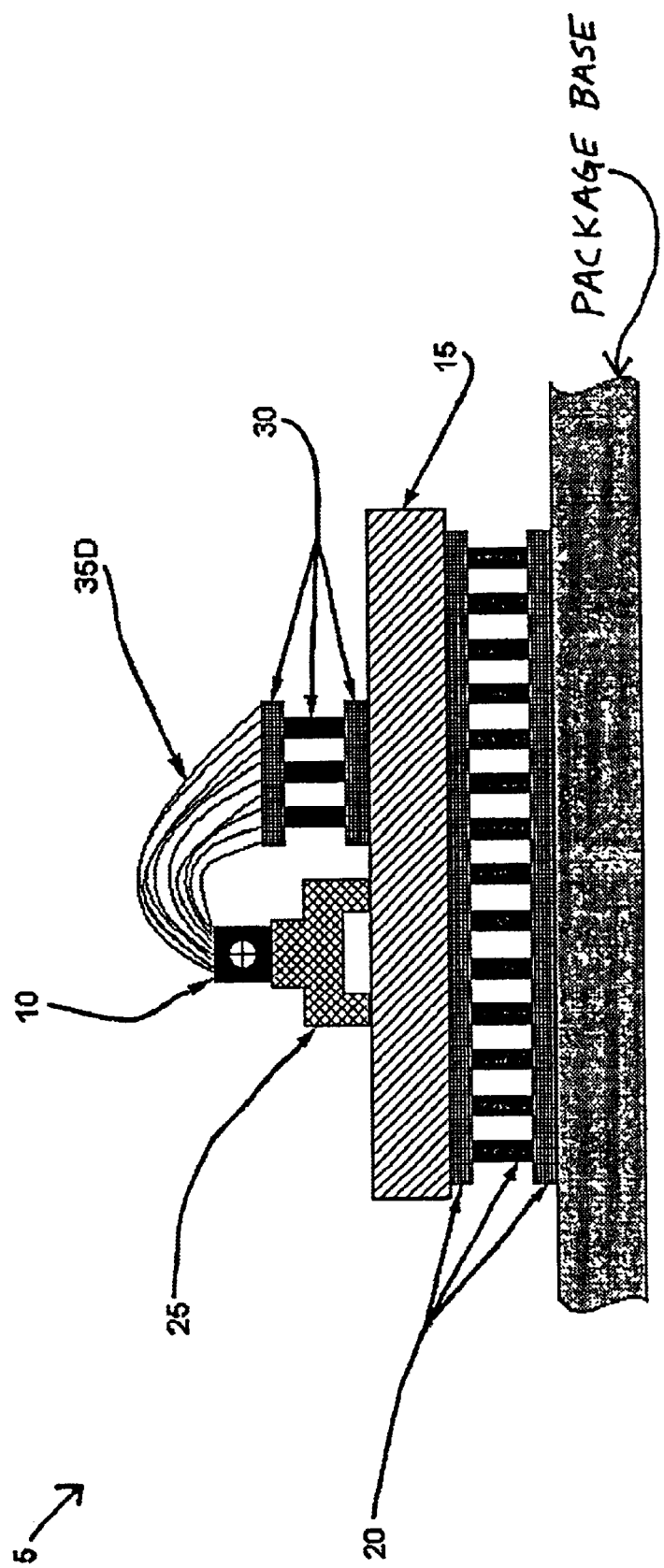
FIG. 4 is a cross-sectional diagrammatical view of an optical platform having an auxiliary thermal management system including thermally conductive strands to thermally connect a temperature sensitive component attached to an insulated mount to an auxiliary cooling device.

Looking at FIG. 4, in a preferred embodiment of the invention, thermal connection 35 comprises one or more thermally conductive strands 35D between temperature sensitive component 10 and auxiliary thermal control system 30. In this embodiment of the invention, temperature sensitive component 10 is thermally isolated from optical platform 15, and is supported in optical alignment, by thermally isolating mount 25. Conductive strands 35D provide a structurally compliant, thermally conductive heat path. This heat path allows auxiliary thermal control system 30 to cool and closely regulate the temperature of thermally isolated temperature sensitive component 10 while conductive strands 35D compensate for any thermal expansion or contraction over thermal connection 35. This compensation of conductive strands 35D during heat transfer prevents the optical alignment of sensitive component 10 from being disturbed. Simultaneously, primary thermal control system 20 regulates the temperature of optical platform 15 and any other components (not shown) in attachment thereto. As such, primary thermal control system 20 is configured in this preferred embodiment of the invention to provide temperature regulation of optical platform 15 and additional cooling to auxiliary thermal control system 30. Due to this additional cooling, auxiliary thermal control system 30 is able to provide additional cooling to temperature sensitive component 10.

Figure 5:
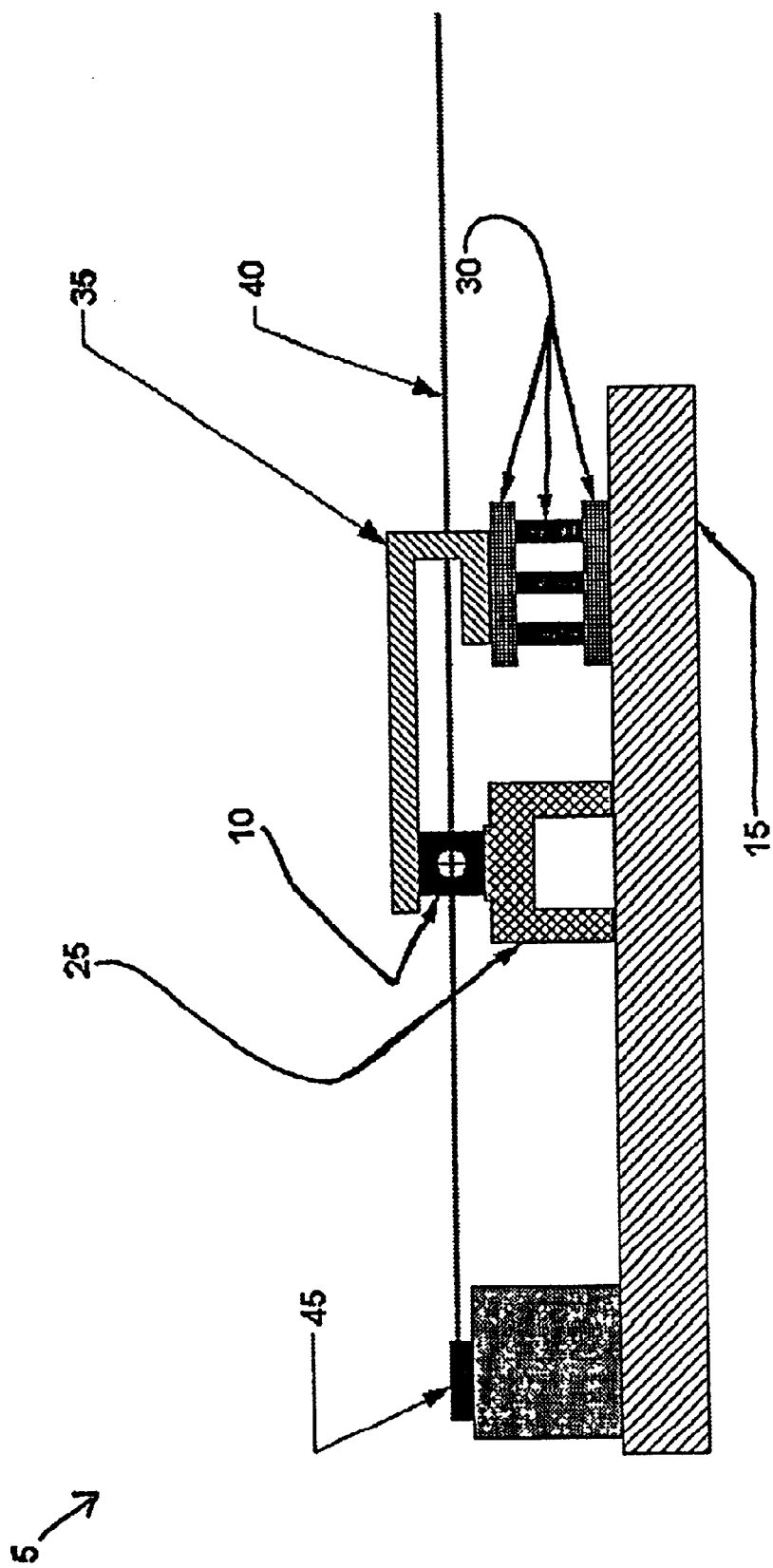
FIG. 5 is a side view of an optical platform having an auxiliary thermal management system including a thermal connection between a temperature sensitive component attached to an insulated mount and an auxiliary cooling device.

Referring now to FIG. 5, in another preferred embodiment of the invention, system 5 is shown with temperature sensitive component 10 thermally isolated from optical platform 15, and supported in optical alignment, by mount 25. In this preferred embodiment of the invention, thermal connection 35 is structurally compliant and thermally conductive to provide a heat path between temperature sensitive component 10 and auxiliary thermal control system 30. Such a compliant heat path allows auxiliary thermal component 30 to cool and regulate the temperature of thermally isolated temperature sensitive component 10 without affecting the optical alignment, shown as reference numeral 40, of temperature sensitive temperature component 10 and optical component 45. The primary thermal control system (not shown) may regulate the temperature of optical platform 15, optical component 45, and other components (not shown) in attachment thereto. In other preferred embodiments of the invention, the primary thermal control system (not shown) may be configured to directly or indirectly provide additional cooling to auxiliary thermal control system 30. Such additional cooling may in turn provide additional cooling to temperature sensitive component 10.

What is claimed is:

1. An apparatus for providing auxiliary cooling and thermal stability to a temperature sensitive opto-electronic component, said apparatus comprising:

a primary thermal control system having a first thermal connection being thermally connected with a primary structure supporting at least one component of an optical system and a second thermal connection being thermally connected with an external environment; and an auxiliary thermal control system having a first thermal connection being thermally connected with said temperature sensitive opto-electronic component, and said auxiliary thermal control system having a second thermal connection being thermally connected with said primary thermal control system whereby said auxiliary thermal control system provides cooling to said temperature sensitive opto-electronic component and said primary thermal control system provides additional cooling to said auxiliary thermal control system through temperature regulation of said primary structure.

2. Apparatus according to claim 1 further comprising an auxiliary structure configured to thermally isolate said temperature sensitive opto-electronic component from each of said primary thermal control system and said primary structure in thermal connection with said primary thermal control system.

3. Apparatus according to claim 1 wherein said first thermal connection between said auxiliary thermal control system and said temperature sensitive opto-electronic component is structurally compliant wherein said compliant thermal connection compensates for thermal expansion or contraction without effecting an optical alignment of said temperature sensitive opto-electronic component relative to said primary structure.

4. Apparatus according to claim 3 wherein said compliant thermal connection comprises a thermally conductive flexure.

5. Apparatus according to claim 3 wherein said compliant thermal connection comprises a set of thermally connected, structurally independent intermeshed fins.

6. Apparatus according to claim 3 wherein said compliant thermal connection comprises a thermally conductive plate having structural flexibility means.

7. Apparatus according to claim 6 wherein said structural flexibility means comprise a corrugated plate.

8. Apparatus according to claim 3 wherein said compliant thermal connection comprises at least one flexible and thermally conductive strand.

9. Apparatus according to claim 1 wherein said primary structure supporting said at least one temperature sensitive component of an optical system comprises an optical platform.

10. Apparatus according to claim 1 wherein said auxiliary thermal control system comprises a thermo-electric device.

11. Apparatus according to claim 1 wherein said primary thermal control system comprises a temperature sensitive thermo-electric device.

12. Apparatus according to claim 10 wherein said primary structure supporting said at least one component of an optical system comprises an optical platform.

13. Apparatus according to claim 1 wherein said temperature sensitive opto-electronic component is alignment sensitive.

14. Apparatus according to claim 13 wherein said alignment sensitive opto-electronic component is aligned with one of said at least one component of said optical system.

15. Apparatus according to claim 3 wherein said opto-electronic component is aligned with one of said at least one component of said optical system.

* * * * *